(12) United States Patent
Fang et al.

(10) Patent No.: US 8,037,379 B1
(45) Date of Patent: Oct. 11, 2011

(54) PREDICTION OF IMPACT ON POST-REPAIR YIELD RESULTING FROM MANUFACTURING PROCESS MODIFICATION

(75) Inventors: Hua Fang, San Jose, CA (US); John Chen, Cupertino, CA (US)

(73) Assignee: PDF Solutions, Inc., San Jose ( * ) Notice: Subject to any disclaimer, the term of this patent is extended or adjusted under 35 U.S.C. 154(b) by 568 days.

(21) Appl. No.: 11/469,353

(22) Filed: Aug. 31, 2006

(51) Int. Cl.
*G11C 29/44* (2006.01)
*G11C 29/50* (2006.01)

(52) U.S. Cl. .................................. 714/718; 714/741
(58) Field of Classification Search .................. None
See application file for complete search history.

(56) References Cited

U.S. PATENT DOCUMENTS

| | | | |
|---|---|---|---|
| 4,398,248 A * | 8/1983 | Hsia et al. | 365/230.03 |
| 5,712,861 A * | 1/1998 | Inoue et al. | 714/752 |
| 5,991,699 A | 11/1999 | Kulkarni et al. | |
| 6,154,714 A | 11/2000 | Lepejian | |
| 6,205,239 B1 * | 3/2001 | Lin et al. | 382/149 |
| 6,947,309 B2 * | 9/2005 | Watanabe et al. | 365/145 |
| 7,506,282 B2 * | 3/2009 | Adams et al. | 716/4 |
| 2001/0000990 A1 * | 5/2001 | Matsudera et al. | 365/189.11 |
| 2003/0097228 A1 | 5/2003 | Satya et al. | |
| 2005/0065842 A1 * | 3/2005 | Summers | 705/11 |
| 2006/0005002 A1 * | 1/2006 | Zimmer et al. | 713/1 |

FOREIGN PATENT DOCUMENTS

JP 2000048596 A * 2/2000

* cited by examiner

*Primary Examiner* — Jeffrey A Gaffin
*Assistant Examiner* — Dipakkumar Gandhi

(57) ABSTRACT

A method for predicting an impact on post-repair yield resulting from manufacturing process modification is described. The method includes receiving bit data representing locations of defective memory cells for a plurality of memory devices. The bit data is modified by removing a selected failure pattern type according to a modification scheme to generate modified bit data. Repairs are simulated on hypothetical memory devices corresponding to the modified bit data, generating a result indicating whether the hypothetical memory device is good or bad. A post-repair yield is then identified and a report is generated indicating the post-repair yield, the post-repair yield representing a number of the plurality of memory devices that would be functional after repair had the plurality of memory devices been manufactured without the selected failure pattern. A method to identify a process providing the best economic benefit is also described.

24 Claims, 7 Drawing Sheets

PREDICTION OF IMPACT ON POST-REPAIR YIELD RESULTING FROM MANUFACTURING PROCESS MODIFICATION

CROSS REFERENCE TO RELATED APPLICATIONS

This Patent Application is related to U.S. patent application Ser. No. 11/515,487, filed on the same date as this Application, and entitled, "Predictive Yield Analysis to Determine Defect Density," which is wholly incorporated by reference.

BACKGROUND

Computer memory devices pose unique challenges in yield improvement. Because memory devices often contain redundant rows and columns, they are capable of being repaired to a limited extent. A "repair" involves deactivating malfunctioning memory cells and replacing them with available redundant cells that are functional. Typically, repairing involves deactivating one or more bad rows and/or columns of data storage locations on the chip and transferring the functionality of the bad rows and/or columns to the redundant rows and/or columns. This can be done, for example, by applying predetermined voltage to specific locations on the chip causing fuses formed into the circuit to disconnect, thereby modifying the circuit.

FIG. 1 shows an exemplary memory device 10 having a main memory region 12 divided into sectors 14. Memory device 10 has a region of redundant rows 18 and a region of redundant columns 20. Redundant rows 18 and columns 20 can be used in place of faulty rows and columns in main memory region 12. In addition, one or more sectors 16 of sectors 14 can be switched off, thereby causing them to be bypassed or ignored in operation. For example, if errors in sector 16 cannot be repaired by using redundant rows or columns, then it can be switched off, and memory device 10 can be converted into a partially-good memory (PGM) device that has less memory capacity than the full designed capacity.

Previously, there has been no reliable approach to predicting the impact of process modification after the repair, or to what extent defective devices can be sold as PGM after repair. The term, "process," refers to the manufacturing process used in producing the memory device. FIG. 2 shows a bar graph presenting exemplary failure rates for a plurality of memory chips. Prior to repair, there are far more single bit failures 32 than any other failure mode. Based on this data, it would appear that the production process should be modified to correct for single bit failures in order to have the greatest yield improvement. However, after repair, it is clear that column patterns 34 are the greater concern since single bit failures can more often be successfully repaired. Therefore, considering the data after the repair, it would make more sense to modify the production process to correct for column patterns. It should be recognized that the data presented in FIG. 2 is for illustration purposes only, and that it represents a real-world problem in simplistic terms. Different types of memory devices have differing failure modes. A process modification for correcting one failure mode can have a negative impact in other failure modes. Unfortunately, the amount of improvement and the amount of negative impact cannot be quantified using current analysis methods because process engineers cannot see beyond the repair to predict the final effect of the process changes.

Furthermore, memory devices can still be sold as partially-good memory even if they do not operate to specifications. PGM devices may have one or more sectors of memory turned off, so they essentially provide less capacity than the maximum capacity possible provided for by the design or specification. This can further complicate the modification of the manufacturing process since more failures of a particular type may be tolerated if the device can still be sold as a PGM device. Again, without knowing the status of the device after being repaired, a sufficiently informed decision cannot be made as to process modifications.

SUMMARY

Broadly speaking, the present invention fills these needs by providing a method and system for predicting impact on post-repair yield resulting from manufacturing process modification.

It should be appreciated that the present invention can be implemented in numerous ways, including as a process, an apparatus, a system, a device, or a method. Several inventive embodiments of the present invention are described below.

In one embodiment, a method for predicting an impact on post-repair yield resulting from manufacturing process modification is provided. The method includes receiving bit data representing locations of defective memory cells for a plurality of memory devices. The bit data is modified by removing a selected failure pattern according to a modification scheme to generate modified bit data. Repairs are simulated on hypothetical memory devices corresponding to the modified bit data, generating a result indicating whether the hypothetical memory device is good or bad. A post-repair yield is then identified and a report is generated indicating the post-repair yield, the post-repair yield representing a number of the plurality of memory devices that would be functional after repair had the plurality of memory devices been manufactured without the selected failure pattern.

In another embodiment, a machine readable medium for predicting an impact on post-repair yield resulting from manufacturing process modification is provided. The machine readable medium embodies computer program instructions causing a computer to perform a method. The method includes receiving bit data representing locations of defective memory cells for a plurality of memory devices. The bit data is modified by removing a selected failure pattern according to a modification scheme to generate modified bit data. Repairs are simulated on hypothetical memory devices corresponding to the modified bit data, each of the repairs generating a result indicating whether the hypothetical memory device is good or bad after the simulated repair. A post-repair yield resulting from the modifying is then identified, the post-repair yield being a number of good memory devices after the repair. Finally, a report is generated that indicates the post-repair yield. The post-repair yield represents a number of the plurality of memory devices that would be functional after repair had the plurality of memory devices been manufactured without the selected failure pattern.

In yet another embodiment, a method for identifying which of a plurality of process modifications provide a highest post-repair yield for a memory device. The method involves identifying a contribution to a post-repair yield loss for each of a plurality of failure patterns, and identifying physical defects causing ones of the plurality of failure patterns with a greatest contribution to post-repair yield loss. A plurality of process changes are then identified which potentially provide the best economic benefit based on the contributions of the post-repair yield loss by the failure patterns. The post-repair yield impact for each of the plurality of process changes is then identified. Then, the costs associated with each of the process changes are estimated and compared with the post-repair yield impact for the process changes to determine which of the plurality of process changes provide a best economic benefit. To identify the contribution to post-repair yield loss, and to compare post-repair yield impact, bit data representing locations of defective memory cells for a plurality of memory devices is received, and modified by removing a selected failure pattern according to a modification scheme to generate modified bit data. Repairs are then simulated on hypothetical memory devices corresponding to the modified bit data, wherein each of the repairs generate a result indicating whether the hypothetical memory device is good or bad after the simulated repair. Then a post-repair yield is identified that results from the bit data modification and the simulated repair.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1:
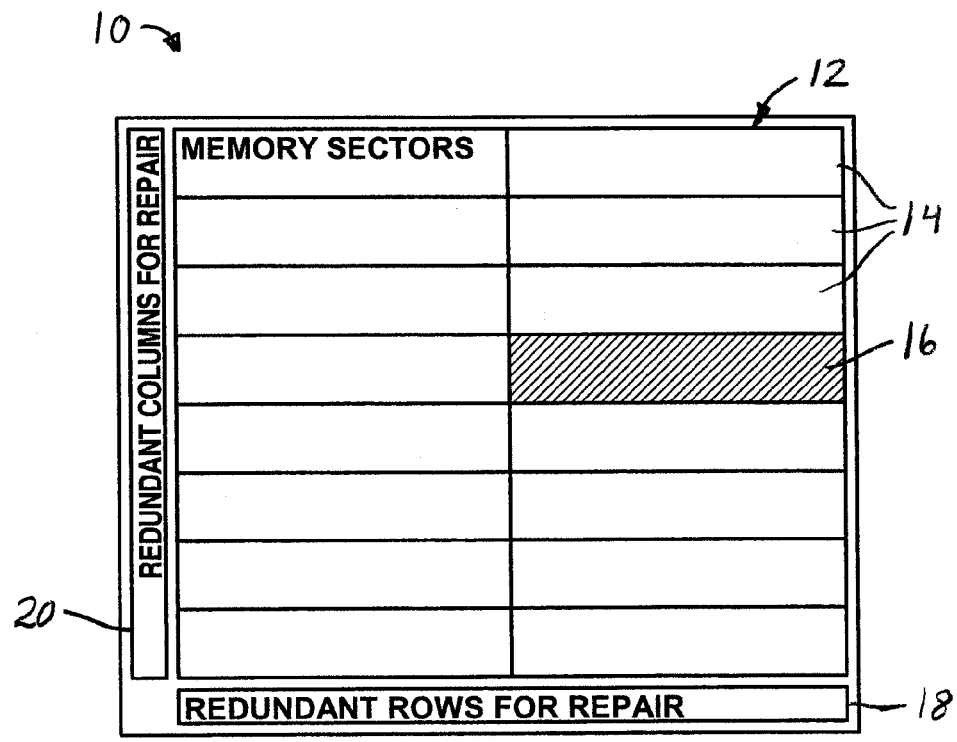
FIG. 1 shows an exemplary memory device having redundant elements and a main memory region divided into sectors.
Figure 2:
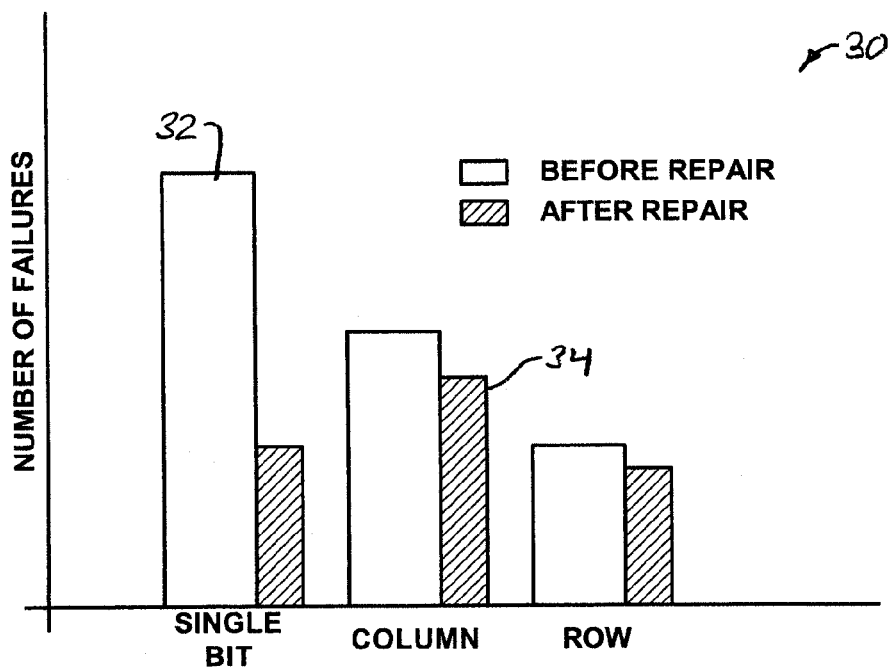
FIG. 2 shows a bar graph presenting exemplary failure rates for a plurality of memory chips.
Figure 3:
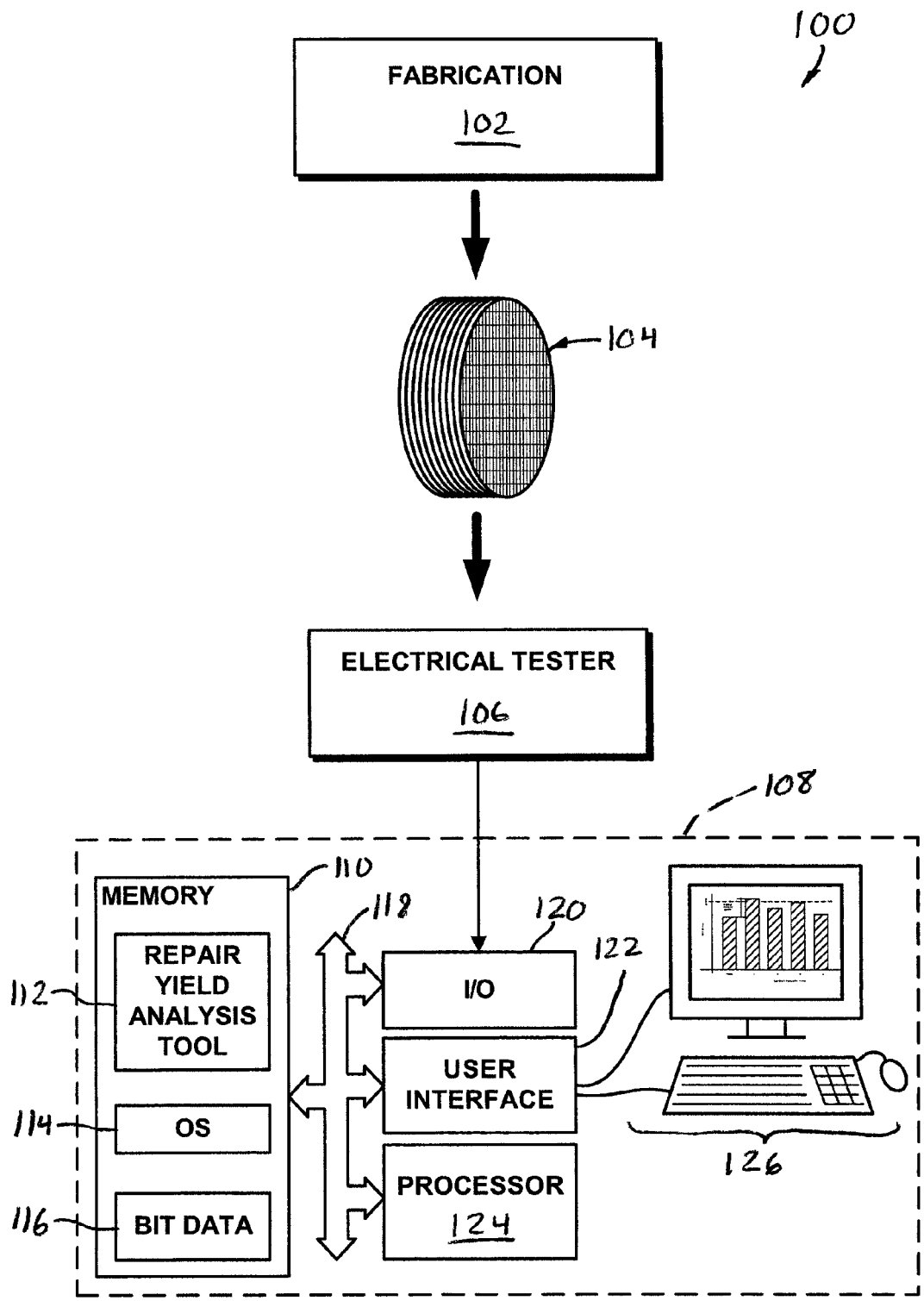
FIG. 3 shows a schematic diagram illustrating an overview of the procedure and systems for predicting the impact on post-repair yield resulting from manufacturing process variations.

FIG. 3 shows a schematic diagram 100 illustrating an overview of the procedure and systems for predicting the impact on post-repair yield resulting from manufacturing process variations. A fabricator 102 produces a plurality of wafers 104 each containing a plurality of memory devices. Each memory device is electrically tested using tester 106 to determine the address of defective memory cells. This information is used to generate bit data representing the failed memory cells as described in further detail below with reference to FIG. 6. The bit data 116 is received from electrical tester 106 into memory 110 computer system 108 via, as an example, input/output interface 122 via a computer network (not shown). Bit data may also be received from electrical tester by way of removable media such as a CD-ROM or DVD-ROM. The bit data specifies the location of each malfunctioning memory cell. In one embodiment, bit data is encoded into bitmaps, which are visual representations of the memory devices, however other representations are also possible.

Memory 110 comprises machine-readable media and may include any combination of removable, non-removable, volatile and/or non-volatile memory, such as primary random access memory and secondary non-volatile mass storage. Memory 110 includes an operating system 114 and a repair yield analysis tool 112. The repair yield analysis tool 112 comprises one or more software programs for carrying out the analysis of bit data 116. Repair yield analysis tool 112 can be executed using operating system 114 and user interface devices 126 connected through user interface ports 120.

Repair yield analysis tool 112 processes bit data 116 as described below with reference to FIG. 4 to generate output data, including a Pareto chart, as described in more detail below with reference to FIGS. 6-9. Process engineers can then use this output data to identify the most economically efficient process, taking into consideration the ability of memory devices to be repaired by taking advantage of redundant memory locations on the device, for example, as described below with reference to FIG. 10.

Figure 4:
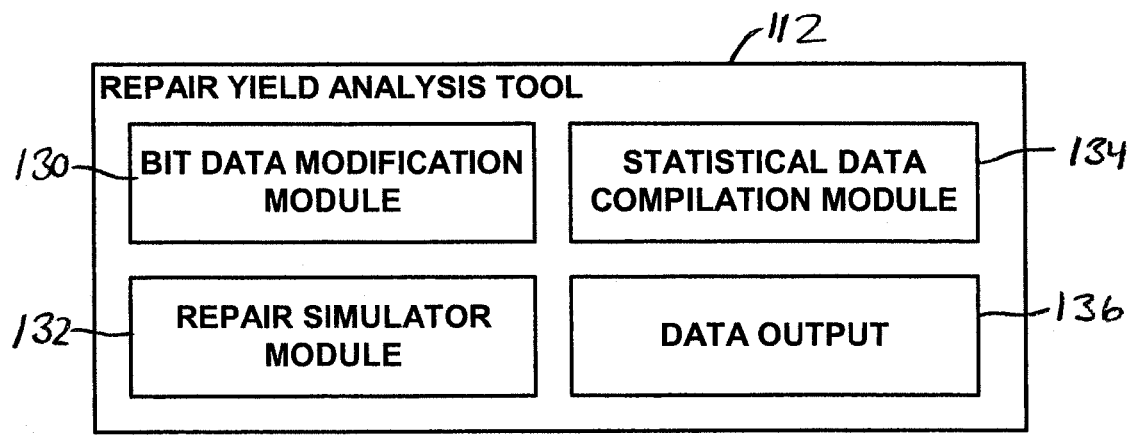
FIG. 4 shows a schematic representation of a memory device repair analysis tool.

FIG. 4 is a schematic representation of repair yield analysis tool 112. Repair yield analysis tool 112 comprises a plurality of software components, including a bit data modification module 130, a repair simulator module 132, a statistical data compilation module 134, and a data output module 136. In one embodiment, each module 130-136 is a software routine incorporated into repair yield analysis tool 112, although in other embodiments, the modules 130-136 may be implemented as independent programs. The function of each module 130-136 will now be further described with reference to FIG. 5.

Figure 5:
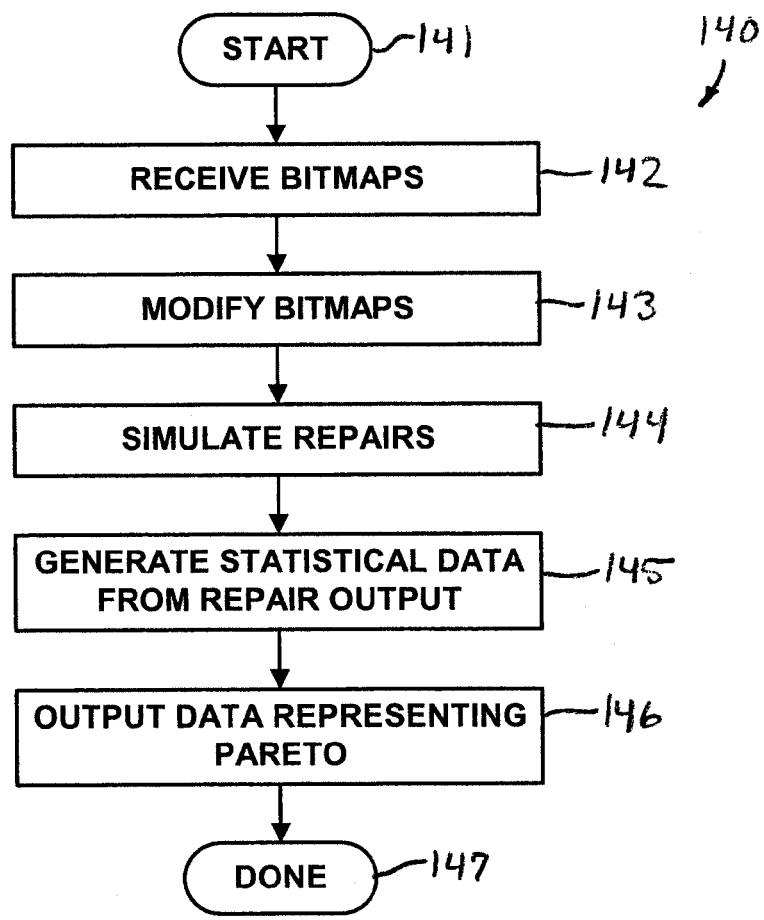
FIG. 5 shows a flowchart presenting an overview of the procedures carried out by the repair analysis tool of FIG. 4.

FIG. 5 shows a flowchart 140 presenting an exemplary overview of the procedures carried out in part by repair analysis tool 112. The procedure begins as indicated by start block 141 and proceeds to operation 142 wherein bit data is received from electrical tester 106 (FIG. 3). Then, in operation 143, selected failure patterns are removed according to a modification scheme using bit data modification module 130. A failure pattern comprises one or more bad memory cells represented as an identifiable pattern in the bit data. Examples include single bit, double bit, row, and column patterns. Failure patterns to be removed may be selected either wholly by a user or in part by a user and in part by the computer, e.g., at random. As will be described below in more detail with reference to FIG. 6, failure patterns are removed by modifying bit data according either a given assumption or according to a predicted response to a change in manufacturing process. In one embodiment, the user selects a pattern type, e.g., column pattern, to remove. In another embodiment, the user selects a removal percentage for each bit data modification scheme such that a selected percentage of instances each failure pattern is removed for each modification scheme. After removing selected failure patterns, the procedure flows to operation 144.

In operation 144, repair of each memory device is simulated using repair simulator module 132. Repair simulator module 132 inputs modified bit data and determines if repair is possible using available redundant resources on the memory device according to a repair algorithm, and if it is possible, the repair simulator module 132 simulates a repair on the memory device and projects whether such a repair would be successful. Modified bit data is bit data in which certain failure patterns were removed in operation 143. Because memory device repair simulation is well understood in the field of memory device engineering, there is no need to describe the details of repair simulations herein.

After simulating the repairs in operation 144, the procedure flows to operation 145, wherein statistical data is generated from the repair output. In one embodiment, the statistical data is simply a compilation of the percentage of good memory devices verses bad memory devices for each manufacturing process change. In another embodiment, a table is produced representing the status of each memory device for each manufacturing process change as good, partially good, or bad. A partially good memory (PGM) device is a memory device containing enough good sectors to meet a previous defined specification to be sold. The device is still operable by turning off the non-functioning sectors. In generating the statistical data, it is also possible to quantify the number and types of errors present in each device post repair for each modification scheme. It should be recognized that output data may be generated with varying levels of abstraction or detail, as suits a particular implementation.

Once statistical data is generated, the procedure flows to operation 146, wherein a Pareto chart and/or other data or representation of data such as a table or graph is generated that encapsulates at least a portion of the generated statistics. In one embodiment, a Pareto chart representing certain data is displayed on a video monitor and/or printed for use by process engineers to assist in determining what process changes will provide the most economical increase in yield gain after repair. The Pareto chart as well as other tables and charts may also be generated using a separate spreadsheet or data analysis software program. Thus, in one embodiment, data output module 136 of FIG. 4 is a spreadsheet or other data analysis program that receives data generated by statistical data compilation module 134. After outputting the Pareto chart and/or other data or representation of data, the procedure ends as indicated as shown in block 147.

Figure 6:
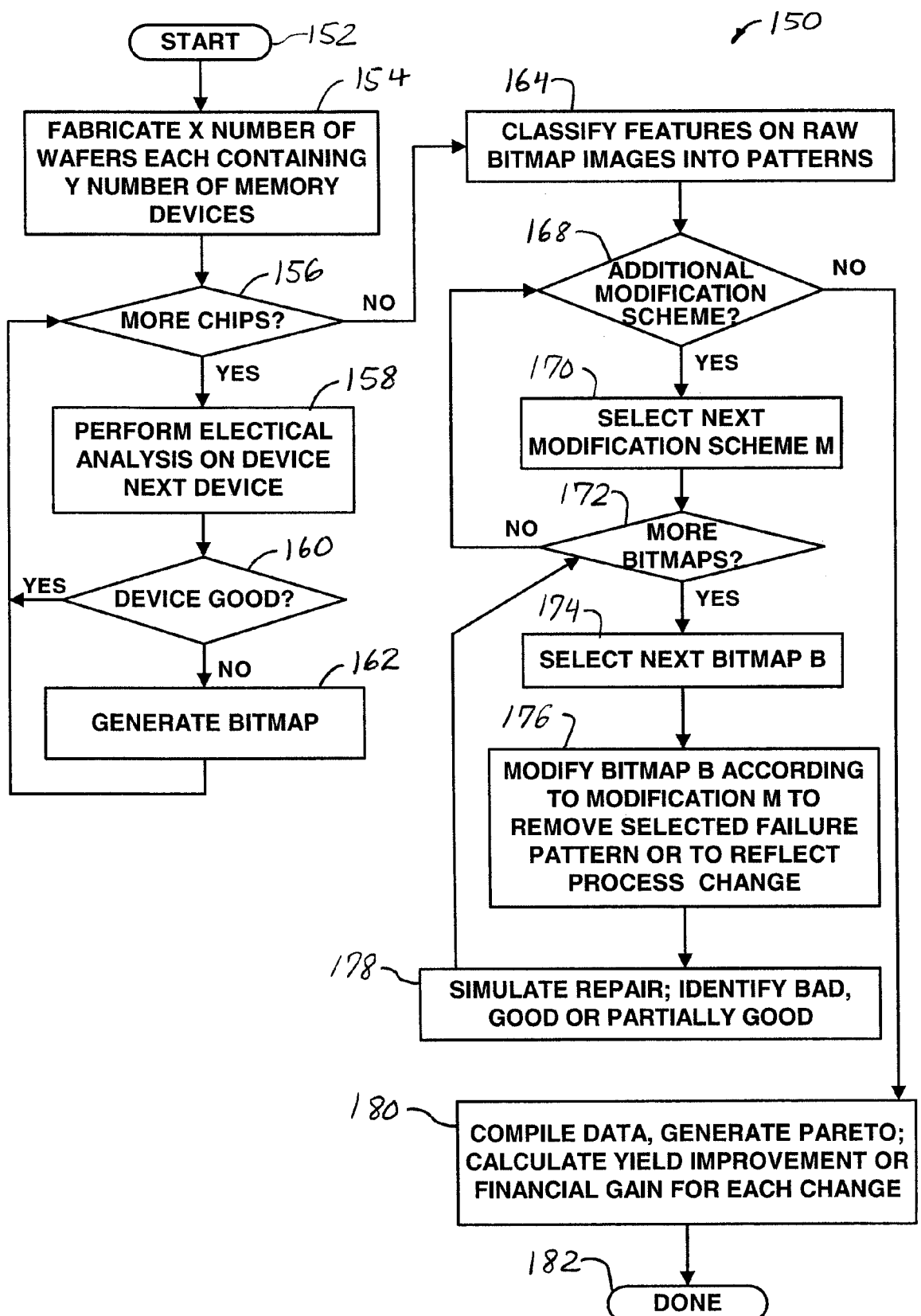
FIG. 6 shows a flowchart presenting an exemplary procedure for generating a Pareto distribution showing projected post-repair yield gains for prospective process modifications.

FIG. 6 shows a flowchart 150 presenting an exemplary procedure for generating a Pareto distribution showing projected yield gains for prospective process modifications, wherein the yield gains take into consideration potential repairs. The procedure begins as indicated by start block 152 and proceeds to operation 154 wherein X number of wafers are produced each having Y number of memory devices formed thereon. The values for X and Y may be selected based on costs and the desired level of accuracy of the results. Once the memory devices are generated, the memory devices are electrically tested using known memory device testing techniques.

Specifically, in operation 156, it is determined whether there are any remaining memory devices to be tested. If all the memory devices have been tested, then the procedure jumps to operation 164. Otherwise, if there are any remaining memory devices to be tested, then the procedure flows to operation 158. In operation 158, the next memory device is electrically tested. The memory devices may be tested in any desired order. Electrical testing comprises electrically connecting the memory device to a testing apparatus. Such testing apparatuses are known in the art and typically comprise a probe for contacting electrical contacts formed on the device, and running one or more tests to ensure that the device operates according to specifications. For memory devices, this may comprise storing and reading a plurality of data patterns. Memory devices are often tested using a circuit built-on the same chip as the memory itself. This test circuit generates the input pattern and reads the output pattern from the memory. The external test machine controls this built-in circuit to initiate or terminate the test, and may also control what data pattern to apply. The on-chip circuit transfers the test response out to the tester. Memory cells that do not correctly return the expected value according to the output pattern, either a zero or a one, are considered defective. The memory devices are typically tested prior to dicing, but can be tested after the dicing operation. Dicing is the process of sawing a wafer into individual chips. A computer controlled testing apparatus automatically maneuvers the probe to each die on a wafer in turn. When the wafer is completed, the next wafer, if any, is loaded into the apparatus. Electrical testing shows either that the memory device operates within specifications or that one or more memory cells (memory locations within the device that store a single bit of information) are defective, i.e., do not operate within specification. The electrical testing generates bit data that identifies the locations of defective memory cells for each memory device. Once the test is completed, the procedure flows to operation 160.

In operation 160, it is determined whether the device just tested is good or is defective. If the memory device is good, then the procedure returns to operation 156. If the memory device is defective, then the procedure flows to operation 162. In operation 162, a bitmap is generated from the bit data that represents the defects in the defective memory device. In the context of memory device fabrication, a bitmap is a visual representation of bit data. More specifically, a bitmap provides a topologically correct digital representation of an image identifying the location of failing memory cells of a particular memory device. Bitmaps are currently used in the field for representing memory device failures.

Figure 7:
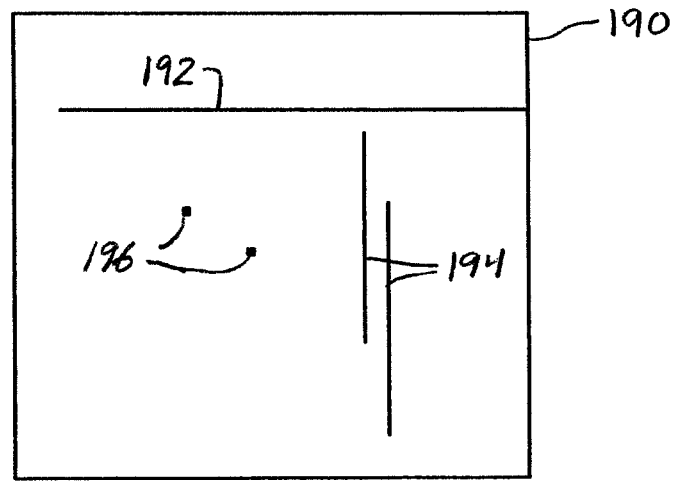
FIG. 7 shows an exemplary bitmap representing locations of memory cell failures in a memory device.

In one embodiment, each bitmap is encoded in the standard graphics interchange format (GIF). In other embodiments, each bitmap is encoded using other image file formats. Generally, functioning memory cells are represented as white pixels and defective memory cells are represented as black pixels. In some cases, the bitmap has a reduced resolution such that each pixel represents multiple memory cells, wherein if any one of the represented memory cells is defective, then the pixel is colored black. For example, a bitmap may map each pixel to a four cell by eight cell block of memory cells. The reduced resolution requires fewer computer resources to store, transmit, and process the bitmap data than would be required for full resolution images. It is also known to use a plurality of colors, each indicating the type of memory test that the particular memory cell failed. FIG. 7 shows an exemplary bitmap 190 having a row pattern 192, two column patterns 194, and two memory cell failures 196. Other types of failures are known such as two-bit failures, four-bit failures, etc. The types of failures that may be identifiable on the bitmap of a particular memory device will depend on they type of memory, e.g., FLASH, dynamic RAM (DRAM), static RAM (SRAM), etc., and how it is designed, e.g., how the circuits are formed into the device.

Once the bitmap is generated, the procedure returns to operation 156 to determine if any more devices are available for testing. Hence, all the devices (X·Y devices) are tested and a bitmap is generated for each defective device. When it is determined at operation 156 that no more devices remain to be tested, the procedure flows to operation 164, in which each of the features in the bitmaps are classified into patterns referred to herein as failure patterns. A failure pattern type is an arrangement or a pattern of defective memory cells in a memory device. Failure pattern types include row patterns, column patterns, single bit failures, four-bit block failures, etc. The failure pattern shows up in a bitmap as a bitmap feature. The types of failure patterns that may be classified will depend on the specific circuit structure of the memory device being evaluated. A failure of the bit line or data line in a memory is usually referred to as a column pattern. A word line failure is usually referred to as a row pattern. After classifying failure patterns, the procedure flows to operation 168.

In operation 168, it is determined whether there are additional modifications schemes to be analyzed. Modification schemes are selected by a process engineer. As will be described in more detail with reference to FIGS. 8A and 8B, the process engineer may, in each simulation, remove all instances of a selected failure pattern type, e.g., all column patterns in one simulation, all row patterns in the next, and so on. Alternatively, the process engineer may choose to remove a percentage of instances of each of multiple failure pattern types, e.g., 40% column pattern patterns and 80% of double-bit failure patterns in one simulation. There are more modifications schemes when not all of the modifications schemes selected by the process engineer have been simulated. If an additional modification scheme has yet to be simulated, then the procedure flows to operation 170, in which the next modification scheme, designated herein as "modification scheme M," is selected. In one embodiment, a baseline is established during one simulation by selecting no modification. After selecting the next modification scheme, the procedure flows to operation 172 to determine if there are any unprocessed bitmaps since selecting current modification scheme M in operation 170. If all the bitmaps have been processed, then the procedure returns to operation 168. Otherwise, when there are more bitmaps to be processed, then the procedure flows to operation 174

In operation 174, the next bitmap is selected for processing. The bitmaps may be processed in any selected order. Once the next bitmap, designated herein as "bitmap B" is selected, the procedure flows to operation 176.

In operation 176, bitmap B is modified according to modification scheme M. If the modification scheme is "no modification" for the purpose of establishing a "real" or baseline data point, then the bitmap is not modified in operation 176 and the procedure flows directly to operation 178. Otherwise, a percentage of instances of the failure patterns as specified by modification scheme M are removed from the bitmap, as it is assumed that they are correctable using a particular change in process that addresses the physical defect causing the particular failure pattern type.

For example, suppose modification scheme M causes all column patterns to be removed. In this case, the resulting post-repair yield gain over the baseline value can be attributed correcting column patterns. Stated another way, the difference between the baseline value and the post-repair yield with a selected pattern removed is the contribution to yield loss attributable to physical defects causing the selected failure pattern type. Techniques for identifying physical defects leading to specific failure pattern types are presented in related U.S. patent application Ser. No. 11/515,487, which is incorporated by reference herein. As an example, assume that the process engineer knows, either through inherent knowledge of the circuit layout or through physical failure analysis (PFA), that column patterns are almost always caused by a defect of the first metallization layer (M1 defect). Assume that it is also known that the process can be modified to correct for this error in 80% of the cases. Therefore, 80% of the improvement in post-repair yield gain identified by removing all column patterns should be achievable. Now assume that the process engineer knows that the particular process modification being considered will also reduce the number of two-bit failures by 40%. The process engineer can then create a modifications scheme that specifies 80% removal of the column patterns and 40% removal of the two-bit failures to project a post-repair yield gain for the specific process modification.

In one embodiment, the bit data modification module 130 (FIG. 4) of repair analysis tool 112 (FIGS. 3, 4) removes selected failure patterns from the bitmaps automatically by reading the bitmap file, scanning the bit data for the specific pattern, and then modifying the bitmap by removing the selected pattern a selected percentage of time as directed by the modification scheme. The modified bit data is then saved as a modified bitmap file or passed directly to repair simulator module 132 (FIG. 4). For example, if the current modification scheme specifies that 80% of column pattern are to be removed, then the computer program will scan for vertical lines present in the bitmap, and 80% of the time (e.g., based on a random variable) will delete any vertical lines discovered. The definition of a column pattern may vary depending on the type of memory device being detected. For example, a column pattern can be recognized wherever there are at least three defective memory cells positioned directly adjacent to each other in a column.

Once the bitmap is modified, the procedure flows to operation 178 wherein bitmap B, as modified in operation 176, is read by a repair simulator module 132 (FIG. 4) which simulates repair of the memory device corresponding to bitmap B. Repair programs and repair simulators that use bitmap images as input are known and available in the art. Based on the simulated repair, the corresponding memory device is categorized as bad, good, or partially good memory (PGM). If the memory device is partially good, then it may be further graded according to the resulting available memory capacity.

After identifying the device as good, bad, or partially good, the procedure returns to operation 172 to determine whether there are any more bitmaps. If there are no more bitmaps then the procedure returns to operation 168 to determine if there are more modification schemes to simulate. If there are no more modification schemes, then the procedure flows to operation 180.

In operation 180, the generated data is compiled. The generated data includes the total number of memory devices tested (product of X and Y) and the number of bad memory devices for each bitmap modification for which a simulated repair was carried out. The resulting data is then used to generate a Pareto diagram shown by way of example in FIG. 8. As mentioned above with reference to FIG. 5, the Pareto chart may be generated from the compiled statistics using a separate application such as a spreadsheet or statistical analysis program. After generating the output Pareto, the procedure ends as indicated by done block 182.

It will be understood that the above procedure is exemplary only and many modifications will occur to those skilled in the art without departing from the spirit and scope of the invention as defined in the appended claims. For example, the order of operations may be changed, or they may be performed concurrently. For example, rather than modifying a bitmap at a time and then simulating repair on that bitmap as described above with regard to operations 176 and 178, all the bitmaps may be modified in one operation, and then the repair simulation may be carried out on all the bitmaps in a second operation.

In many instances, it may be helpful to assume that all, i.e., 100%, of the failure patterns of the given type are removed by a particular hypothetical process. This greatly enhances process engineers' understanding of the impact the presence of a particular failure pattern type has in memory after repair, which is information currently unavailable to them. Once they understand the contribution to post-repair yield loss attributable to a particular failure pattern type, they can use this information to form an opinion as to the post-repair impact a specific process modification might have.

Figure 8A:
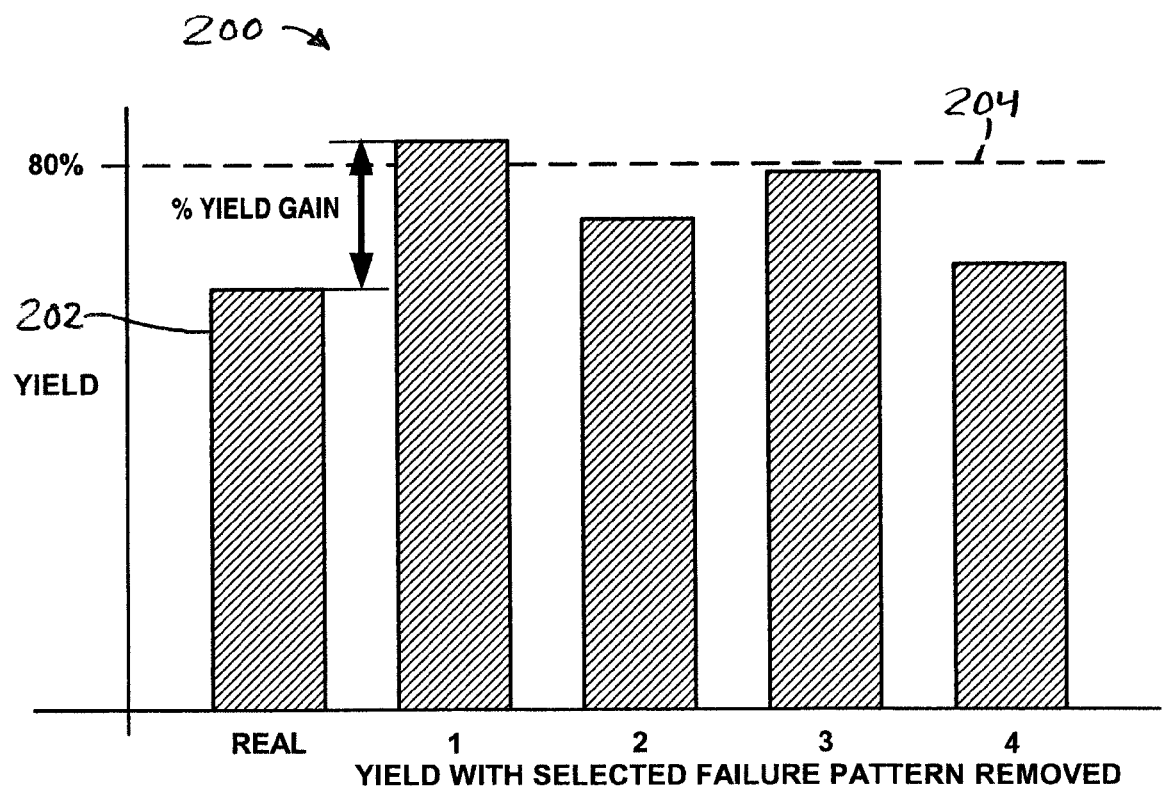
FIG. 8A shows an exemplary Pareto diagram in the form of a bar graph representing post-repair yield after removing selected failure patterns.

FIG. 8A shows an exemplary Pareto chart 200 in the form of a bar graph representing the potential gain for each process modification affecting each failure pattern type, numbered 1 through 4. In addition, a bar 202 represents a baseline post-repair yield with no bitmap modification. Pareto chart 200 is provided for illustration purposes only and does not represent actual simulation data. As described above with reference to FIG. 6, the repair for the baseline yield is simulated and therefore may vary slightly from an actual yield. Pareto chart 200 also identifies an 80% post-repair yield target 204, and therefore identifies which of the process modifications are capable of reaching that target, in this case, a hypothetical process modification causing 100% of all failure patterns of type 1 to be eliminated. In addition, a post-repair percent yield improvement for each process modification is also ascertainable by measuring the difference between the real yield 202 and the projected yields. This difference shows the contribution to post-repair yield loss attributable to physical defects causing the specific failure pattern.

Figure 8B:
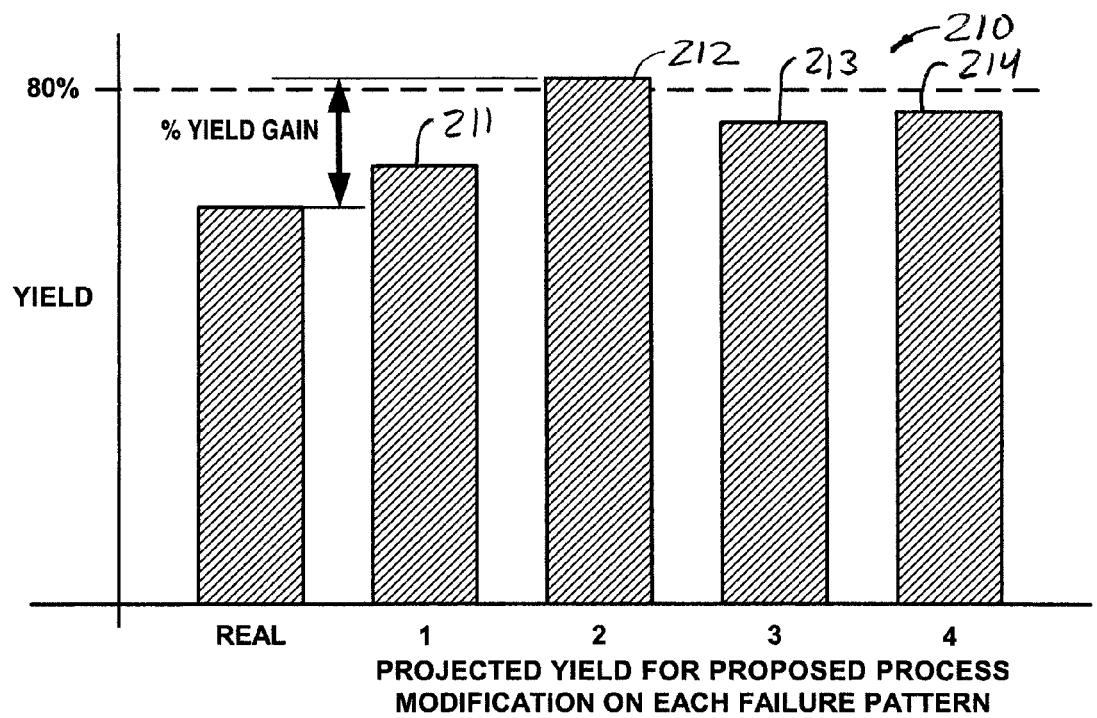
FIG. 8B shows an exemplary Pareto diagram in the form of a bar graph representing post-repair yield for each of a plurality of manufacturing changes.

FIG. 8B shows a second exemplary Pareto chart 210 representing results of a different simulation. Again, these results are provided for illustration purposes only and do not reflect the results of an actual simulation. In this case, each bar 211, 212, 213, and 214 represent the post-repair yield resulting from a hypothetical process modification. Those skilled in memory device fabrication will understand that certain failure pattern types can be assumed to be caused by a particular type of physical defect. For example, a single bit failure pattern may correspond to an open via, whereas a row pattern may correspond to an M1 (first metallization layer) failure. If the cause of a particular failure pattern type is unknown, then it can be determined using physical failure analysis (PFA). PFA encompasses a variety of techniques known in the field of semiconductor failure analysis for identifying a specific failure. PFA techniques include delayering and inspection, destructive cross-sectioning, etc., generally using scanning electron microscopes (SEMs). For memory devices, identifying the location of a failure for PFA is usually not a problem since it is generally dictated by the address of the defective memory cell. Once the physical defect or defects causing a specific failure pattern type is identified, then alternative process modifications can be proposed.

Using available knowledge and analysis techniques, the process engineer can estimate the impact that the possible process modifications will have on the physical causes, which will then relate back to the failure patterns. The procedure outlined in FIG. 6 can then be repeated to project yield gains for each of the process modifications. Specifically, each bitmap modification scheme can reflect a proposed process modification, each of which can potentially impact a plurality of failure pattern types. In addition, it is possible for a manufacturing process modification to reduce or increase the number of failure patterns of a specific type. While the goal of the proposed process change is to reduce the number of instances for certain fail patterns to improve yield, the change may cause an increase of instances of another type of fail patterns, as a side-effect. Thus, in addition to representing the intended result by removing fail pattern instances, new pattern instances may be added to reflect the less-desirable side effect to ensure the accuracy of the yield prediction. In one embodiment, if the bitmap modification scheme causes for an increase in the number of a failure pattern type, then bitmap modification operation 176 in FIG. 6 may include duplicating certain failure pattern instances from previous bitmaps onto the current bitmap or onto a new blank bitmap (representing a good memory device that is made bad by the proposed process modification). Such bitmap manipulations may be according to a prediction algorithm generated by process engineers to simulate various process modification scenarios. Thus, each bar 211, 212, 213, and 214 of FIG. 8B represents a yield for a specific proposed process modification, each of which may represent reductions of the number of failure patterns in a single failure pattern type or a plurality of failure pattern types. In addition, there may be increased instances of a particular failure pattern type resulting from a proposed process modification.

Figure 9:
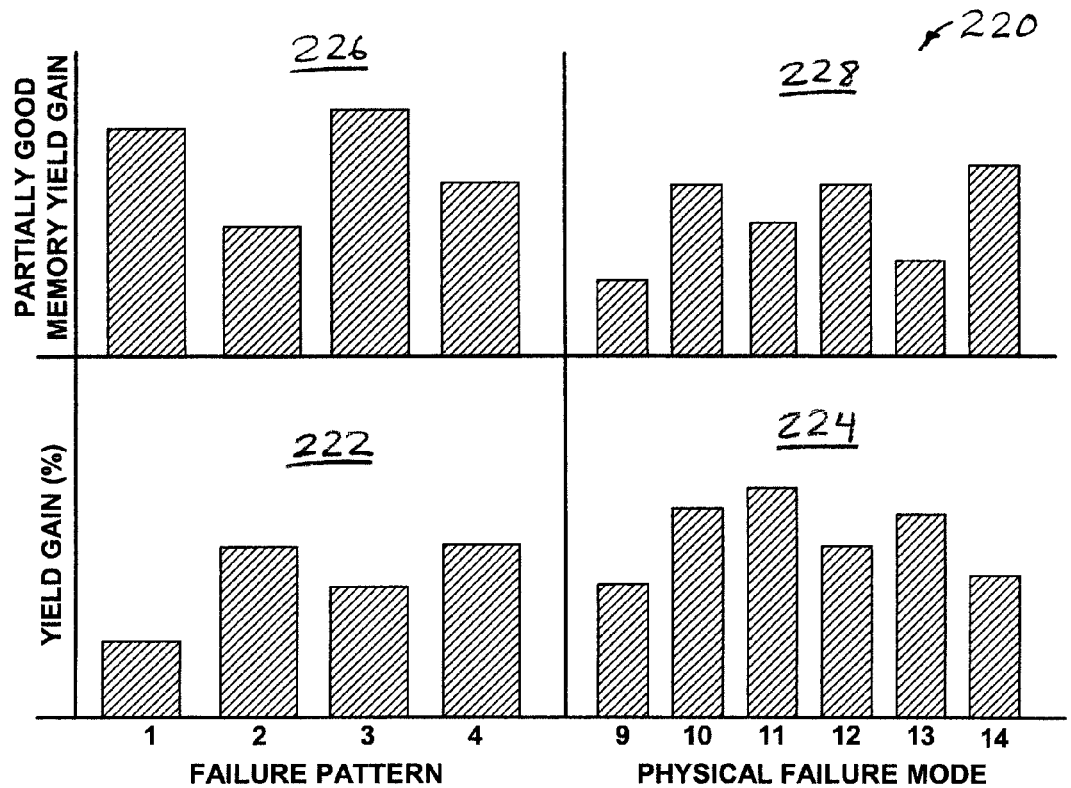
FIG. 9 shows a combined Pareto chart that incorporates four bar graphs showing yield gain and partially-good memory yield gains.

FIG. 9 shows a Pareto chart 220 that incorporates four bar graphs, all of which are provided for illustration purposes only. Bar graph 222 is similar to the Pareto chart shown in FIG. 8A but represents a percent yield gain (i.e., over baseline) for each analyzed failure pattern type. Bar graph 224 is a translation of the failure pattern types described in bar graph 222 to physical failure defects causing each failure pattern type. Thus, each bar represented in bar graph 224 represents a percent gain in yield attributable to a hypothetical process modification to correct one of physical failure modes 9-14. Depending on the architecture of the memory device being evaluated, there may not be a one-to-one correspondence between failure pattern types in bar graph 222 and physical failure modes in bar graph 224. Rather, there may be a many-to-one correspondence or a one-to-many correspondence, or a combination thereof for different failure pattern types. For example, a specific failure pattern type, e.g., a column pattern, may be attributable 60% of the time to a first metallization layer short and 40% of the time to a via defect. Therefore, 40% yield gain associated with correcting for 100% of the column patterns (as represented by one bar in bar graph 222) may correlate to a 12% yield gain attributable to correcting M1 shorts and a 8% yield gain when correcting for open vias as represented by, e.g., bars 13 and 14 in bar graph 224. The correlation between failure pattern types and physical failure modes can be based on a known understanding between them or on the results of applying known physical failure analysis techniques such as those previously described.

In many cases, even where a particular memory device contains defective sectors, it may still be sold as partially good memory (PGM). Bar graph 226 describes the PGM yield gain for each failure pattern type assumed to be eliminated according to the procedure described above with reference to FIGS. 6 and 8A. Each of the PGM gains can also be correlated to the physical failure modes as shown in bar graph 228, in a manner similar to that described above with respect to bar graph 224. These bar graphs depict associated statistical information that provides important information. As can be seen, for failure pattern 1, there is a very low yield gain in good devices as represented in bar graph 222, but a very high gain in PGM as represented in bar graph 226. Likewise, failure pattern 2 represents a strong yield gain in bar graph 222 but a weaker increase in PGM in bar graph 226. This could, for example, be explained by mostly converting bad die into PGM die for failure pattern 1, and by mostly converting PGM die and bad die into good memory for failure pattern 2. An engineer can then determine, based on these results, which hypothetical process returns the most economical benefit, taking into consideration the reduced value of PGM verses good memory.

Figure 10:
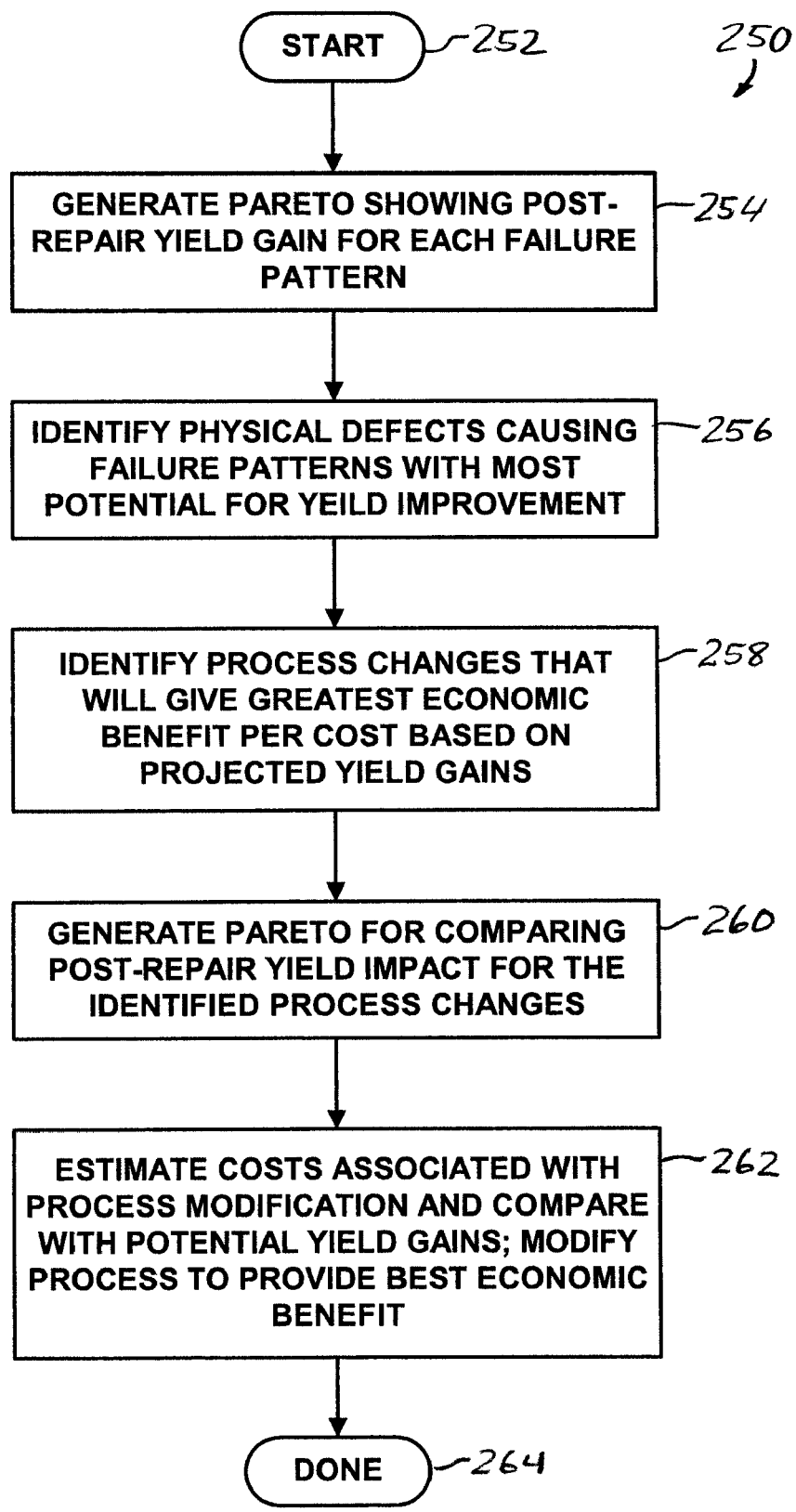
FIG. 10 shows a flowchart that provides an exemplary procedure for selecting an optimum design to make the most economical choices among a variety of options, taking into consideration the impact that memory repair has on the resulting product.

FIG. 10 shows a flowchart 250 that provides an exemplary procedure for selecting an optimum design to make the most economical choices among a variety of options, taking into consideration the impact that memory repair has on the resulting product. The procedure begins as indicated by start block 252 and proceeds to operation 254 wherein a Pareto is generated showing post-repair yield for a plurality of hypothetical process changes each eliminating one of a plurality of failure pattern types. The Pareto is generated as described above with respect to FIGS. 6 and 8A.

Next, in operation 256, the process engineer identifies physical defects that causes the failure pattern types having the most potential for yield improvement. Once these prevailing physical defects are identified, then, in operation 258, the process engineer can identify potential process changes that give the greatest economic benefit per cost based on the hypothetical yield gains identified in operation 254. The process engineer can then predict the impact on multiple failure pattern types for each potential process change and, in operation 260, generate a new Pareto comparing post-repair yield impacts associated for each identified process change. This new Pareto can be generated as described above with reference to FIGS. 6 and 8B. Finally, in operation 262, the process engineer can estimate costs associated with each process modification and compare these costs with the potential gains as projected by the Pareto generated in operation 260. The process engineer can then modify the process according to the most economical option to provide the best economical benefit. The procedure then ends as indicated by done block 264.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as producing, identifying, determining, or comparing.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for predicting an impact on post-repair yield, the method comprising:
  receiving bit data representing locations of defective memory cells for a plurality of memory devices;
  modifying the bit data, wherein said modifying the bit data comprises removing a plurality of instances of a failure pattern of a selected failure pattern type according to a modification scheme to generate modified bit data;
  simulating repairs on hypothetical memory devices corresponding to the modified bit data, wherein each repair generates a result indicating whether the hypothetical memory device is one of functional and non-functional after the simulated repair;
  identifying a post-repair yield resulting from the modifying, wherein the post-repair yield is a number of functional memory devices after the repair;
  identifying whether ones of the hypothetical memory devices that are indicated as non-functional can be converted into partially-functional memory in which one or more sectors are switched off; and
  generating a report indicating the post-repair yield, wheerin the post-repair yield represents a number of the plurality of memory devices that would be functional after repair had the plurality of memory devices been manufactured without the instances of the failure pattern, and wherein the report further indicates a post-repair number of partially-functional memories.

2. The computer implemented method of claim 1, further comprising:
  repeating the modifying, the simulating, and the identifying according to at least one other modification scheme, wherein each of the at least one other modification scheme specifies removing an additional plurality of instances of failure patterns of at least one additional selected failure pattern type.

3. The computer implemented method of claim 2, wherein generating a report comprises generating a post repair yield for each of the modification schemes.

4. The computer implemented method of claim 3, wherein generating a report comprises generating a graph representing the post repair yield for each of the modification schemes.

5. The computer implemented method of claim 2, further comprising simulating repair on the bit data without modifying the bit data thereby providing a baseline post-repair yield amount, wherein generating the report comprises calculating a yield gain for each modification scheme by comparing the post-repair yield resulting from the modifying to the baseline post-repair yield.

6. The computer implemented method of claim 2, further comprising:
    identifying whether ones of the hypothetical memory devices that are indicated as non-functional can be converted into partially-functional memory in which one or more sectors having defects are switched off; and
    wherein the report further indicates, for each modification scheme, a post-repair number of partially-functional memories.

7. The computer implemented method of claim 2, wherein each modification scheme specifies, for each of the failure pattern types, the removing of a selected percentage of instances of said each of the failure pattern types.

8. The computer implemented method of claim 1, wherein the modification scheme specifies the removing of a selected percentage of instances of the selected failure pattern type.

9. The computer implemented method of claim 1, wherein the bit data is encoded into bitmaps, each bitmap encoding a topologically correct digital representation of an image identifying the locations of the defective memory cells of a particular memory device.

10. The computer implemented method of claim 1, wherein the bit data is generated as a result of electrical testing of the plurality of memory devices.

11. A machine readable non-transitory medium embodying computer-executable instructions for predicting an impact on post-repair yield resulting from manufacturing process modification, the computer-executable instructions comprising:
    instructions to receive bit data representing locations of defective memory cells for a plurality of memory devices;
    instructions to modify the bit data by removing a plurality of instances of a failure pattern of a selected failure pattern type according to a modification scheme to generate modified bit data;
    instructions to simulate repairs on hypothetical memory devices corresponding to the modified bit data, wherein each repair generates a result indicating whether the hypothetical memory device is one of functional and non-functional after the simulated repair;
    instructions to identify a post-repair yield resulting from the modifying, wherein the post-repair yield is a number of functional memory devices after the repair;
    instructions to identify whether ones of the hypothetical memory devices that are indicated as non-functional can be converted to partially-functional memory in which one or more sectors are switched off; and
    instructions to generate a report indicating the post-repair yield, wherein the post-repair yield represents a number of the plurality of memory devices that would be functional after repair had the plurality of memory devices been manufactured without the instances of the failure pattern, and wherein the report further indicates, for each modification scheme, a post-repair number of partially-functional memories.

12. The machine readable non-transitory medium of claim 11, further comprising:
    instructions to repeat the modifying, the simulating, and the identifying according to at least one other modification scheme, wherein each of the at least one other modification scheme specifies removing an additional plurality of instances of failure patterns of at least one additional selected failure pattern type.

13. The machine readable non-transitory medium of claim 12, wherein generating the report comprises generating a post repair yield for each of the modification schemes.

14. The machine readable non-transitory medium of claim 13, wherein generating the report comprises generating a graph representing the post repair yield for each of the modification schemes.

15. The machine readable non-transitory medium of claim 12, further comprising instructions to simulate repair on the bit data without modifying the bit data thereby providing a baseline post-repair yield amount, wherein generating the report comprises calculating a yield gain for each modification scheme by comparing the post-repair yield resulting from the modifying to the baseline post-repair yield amount.

16. The machine readable non-transitory medium of claim 12, wherein each modification scheme specifies, for each of the failure pattern types, the removing of a selected percentage of the instances of said each of the failure pattern types.

17. The machine readable non-transitory medium of claim 16, wherein each modification scheme specifies removing 100% of the instances of a corresponding one of the failure pattern types.

18. The machine readable non-transitory medium of claim 11, further comprising:
    instructions to identify whether ones of the hypothetical memory devices that are indicated as non-functional can be converted into partially-functional memory in which one or more sectors are switched off; and
    wherein the report further indicates a post-repair number of partially-functional memories.

19. The machine readable non-transitory medium of claim 11, wherein the modification scheme specifies removing a selected percentage of instances of the selected failure pattern type.

20. The machine readable non-transitory medium of claim 19, wherein the selected percentage is 100%.

21. The machine readable non-transitory medium of claim 11, wherein the bit data is encoded into bitmaps, wherein each bitmap encodes a topologically correct digital representation of an image identifying the locations of the defective memory cells of a particular memory device.

22. The machine readable non-transitory medium of claim 11, wherein the bit data is generated as a result of electrical testing of the plurality of memory devices.

23. A method for identifying which of a plurality of process modifications provide a highest post-repair yield for a memory device, the method comprising:
    identifying a contribution to a post-repair yield loss for each of a plurality of failure pattern types;
    identifying physical defects causing ones of the plurality of failure pattern types with a greatest contribution to post-repair yield loss;
    identifying a plurality of process changes for ameliorating the post-repair yield loss of the failure pattern types;
    comparing post-repair yield impact for each of the plurality of process changes;
    estimating costs associated with each of the process changes; and
    selecting one of the plurality of process changes based on economic benefit derived from the post-repair yield impact and the estimated costs.

24. The method of claim 23, wherein said identifying the contributions to post-repair yield loss, and said comparing the post-repair yield impacts comprises:
    receiving bit data representing locations of defective memory cells for a plurality of memory devices;

modifying the bit data, wherein modifying the bit data comprises removing a plurality of instances of a failure pattern of a selected failure pattern type according to a modification scheme to generate modified bit data;

simulating repairs on hypothetical memory devices corresponding to the modified bit data, wherein each repair generates a result indicating whether the hypothetical memory device is one of functional and non-functional after the simulated repair; and identifying a post-repair yield resulting from the modifying, wherein the post-repair yield is a number of good memory devices after the repair.

* * * * *